United States Patent
Hamidian et al.

(10) Patent No.: US 10,826,446 B2
(45) Date of Patent: Nov. 3, 2020

(54) POWER AMPLIFIER

(71) Applicant: NXP B.V., Eindhoven (NL)

(72) Inventors: Amin Hamidian, Nijmegen (NL); Mark Pieter van der Heijden, Eindhoven (NL); Jozef Reinerus Maria Bergervoet, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/354,277

(22) Filed: Mar. 15, 2019

(65) Prior Publication Data
US 2019/0334489 A1 Oct. 31, 2019

(30) Foreign Application Priority Data
Apr. 26, 2018 (EP) .................................. 18169455

(51) Int. Cl.
| H03F 3/16 | (2006.01) |
| H03F 3/217 | (2006.01) |
| H01F 27/28 | (2006.01) |
| H01F 30/02 | (2006.01) |
| H01L 23/66 | (2006.01) |
| H03F 1/56 | (2006.01) |
| H03F 3/195 | (2006.01) |

(52) U.S. Cl.
CPC ......... H03F 3/217 (2013.01); H01F 27/2804 (2013.01); H01F 30/02 (2013.01); H01L 23/66 (2013.01); H03F 1/56 (2013.01); H03F 3/195 (2013.01); H01F 2027/2809 (2013.01); H01L 2223/6655 (2013.01); H01L 2223/6672 (2013.01); H03F 2200/387 (2013.01); H03F 2200/391 (2013.01); H03F 2200/451 (2013.01)

(58) Field of Classification Search
CPC ........................................................ H03F 3/16
USPC ................................................. 330/277, 302
See application file for complete search history.

(56) References Cited

U.S. PATENT DOCUMENTS

| 4,835,485 A * | 5/1989 | Mueller ............. G01R 33/3621 330/277 |
| 5,146,178 A | 9/1992 | Nojima et al. |
| 6,111,461 A * | 8/2000 | Matsuno ............... H03F 1/3247 330/127 |
| 7,345,538 B2 * | 3/2008 | Wagner ..................... H03F 1/02 330/140 |

(Continued)

FOREIGN PATENT DOCUMENTS

EP 2262107 A1 12/2010

*Primary Examiner* — Henry Choe

(57) ABSTRACT

A power amplifier. The power amplifier includes a plurality of parallel coupled transistors. Each transistor has a control terminal coupled to receive a signal to be amplified and an output terminal coupled to a node. The power amplifier also includes a matching network having an input coupled to the node and an output coupleable to a load. The power amplifier further includes a first circuit branch forming a choke and harmonic trap of the power amplifier. The first circuit branch includes a first inductance, a second inductance and a first capacitor. The first inductance has a first terminal coupled to the node and a second terminal coupled to a first terminal of the second inductance. A second terminal of the second inductance is coupled to AC ground. The first capacitor is coupled in parallel with the second inductance.

20 Claims, 6 Drawing Sheets

(56) References Cited

U.S. PATENT DOCUMENTS

| | | | | |
|---|---|---|---|---|
| 7,554,410 | B2* | 6/2009 | Kawashima | H03F 1/56 330/302 |
| 8,912,845 | B2* | 12/2014 | Jordan | H03F 3/195 330/79 |
| 2004/0041634 | A1* | 3/2004 | Sugiura | H03F 3/191 330/302 |
| 2008/0094142 | A1 | 4/2008 | Kawashima et al. | |
| 2014/0320205 | A1 | 10/2014 | Lyalin et al. | |

* cited by examiner

POWER AMPLIFIER

CROSS-REFERENCE TO RELATED APPLICATIONS

This application claims the priority under 35 U.S.C. § 119 of European Patent application no. 18169455.5, filed on 26 Apr. 2018, the contents of which are incorporated by reference herein.

BACKGROUND

The present specification relates to a power amplifier.

A common design requirement in a power amplifier for RF and mm wave applications is efficiency in terms of power consumption. Class E and class F amplifiers use output networks including passives to reduce power consumption and consequently improve efficiency by exploiting harmonics.

In many cases, as the losses of the extra components needed for the higher harmonic terminations may exceed the benefit of using them. Because of this, oftentimes only the $2^{nd}$ and $3^{rd}$ harmonics are utilised in these kinds of amplifiers. In an on-chip design, even the realization of the $2^{nd}$ and $3^{rd}$ harmonic terminations may be problematic, owing to the complicated and lossy arrangement of the required components and/or in view of size constraints. In view of this, in some on-chip designs, the $3^{rd}$ and higher harmonics may not be used. Nevertheless, just using the $2^{nd}$ harmonic can still lead to measurable improvements in efficiency over a class A amplifier.

U.S. Pat. No. 5,146,178 A describes an impedance matched class-F high frequency amplifier that includes an input matching circuit receiving high frequency signals connected to the gate of the FET. The drain of the FET is connected to an output matching circuit which matches the fundamental frequency and the second harmonic frequency, and the output of the output matching circuit is connected to an even harmonic terminating circuit. The stray reactance component at the output impedance of the FET is offset by the output matching circuit, and therefore the even harmonics terminating circuit can more accurately terminate the second harmonic frequencies.

EP 2,262,107 A1 describes an inverse class F amplifier and method. The inverse class F amplifier comprises: an input operable to receive a microwave frequency signal to be amplified; an output operable to provide an amplified signal too load; and a network coupling the input with the output and operable to amplify the microwave frequency signal to generate the amplified signal, the network comprising an amplifying device and a load network comprising at least one variable length transmission line operable to have its length adjusted to vary its effective electrical length to provide, to the amplifying device, a first impedance at a fundamental frequency of the microwave frequency signal, a second impedance at a second harmonic frequency of the microwave frequency signal, the second impedance being higher than the first impedance and a third impedance at a third harmonic frequency of the microwave frequency signal, the third impedance being lower than the first impedance.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a power amplifier comprising:
a plurality of parallel coupled transistors, wherein each transistor has a control terminal coupled to receive a signal to be amplified and an output terminal coupled to a node;
a matching network having an input coupled to said node and an output coupleable to a load;
a first circuit branch forming a choke and harmonic trap of the power amplifier, the first circuit branch comprising:
a first inductance;
a second inductance; and
a first capacitor,
wherein the first inductance has a first terminal coupled to said node and a second terminal coupled to a first terminal of the second inductance,
wherein a second terminal of the second inductance is coupled to AC ground, and
wherein the first capacitor is coupled in parallel with the second inductance.

According to embodiments of the present disclosure, the choke and harmonic trapping functions may be provided in the same circuit branch of a power amplifier. This can reduce the number and/or size of the components used in the power amplifier.

The first circuit branch may include an auto-transformer coupled to provide the first inductance and the second inductance. When an auto-transformer is used, there may be some coupling between the first inductance and the second inductance, in which case the overall size of the components (windings) used to provide the first and second inductances may be reduced.

The auto-transformer may comprise a common winding. A first part of the common winding may provide the first inductance. A second part of the common winding may provide the second inductance.

The first terminal of the first inductance may comprises a first terminal of the auto-transformer. The second terminal of the second inductance may comprise a second terminal of the auto-transformer. The second terminal of the first inductance and the first terminal of the second inductance comprise a tap of the auto transformer.

The tap may be located along the common winding at a position intermediate the first part and the second part.

The first inductance and the second inductance may be formed by separate inductors.

The power amplifier may have more than one choke and harmonic trap branch connected to the node. This may allow a larger choke inductance to be provided for the power amplifier and may allow for better load balancing between the plurality of transistors. In one embodiment, the power amplifier further includes:
a second circuit branch forming a choke and harmonic trap of the power amplifier, the second circuit branch comprising:
a third inductance;
a fourth inductance; and
a second capacitor,
wherein the third inductance has a first terminal coupled to said node and a second terminal coupled to a first terminal of the fourth inductance,
wherein a second terminal of the fourth inductance is coupled to AC ground, and
wherein the second capacitor is coupled in parallel with the second inductance.

The second circuit branch may also include an auto-transformer. The auto transformer of the second branch may be coupled to provide the third inductance and fourth inductance. The auto-transformer of the second circuit branch may be configured similarly to the above mentioned auto-transformer of the first circuit branch.

The third inductance the fourth inductance may be formed by separate inductors.

Each of the plurality of parallel connected transistors may be a bipolar junction transistor. In some embodiments, the bipolar junction transistor may be Heterojunction Bipolar transistors (HBTs). Each control terminal may thus be a base terminal and each output terminal may thus be a collector terminal of the bipolar junction transistor.

It is also envisaged that Field Effect Transistors (FETs) could be used. For instance, MOSFET transistors could be used instead of bipolar junction transistors. In such embodiments, each control terminal would be a gate terminal and each output terminal would be a source or a drain terminal. It is further envisaged that High Electron Mobility Transistors (HEMTs), metal-semiconductor field-effect transistors (MESFETs) or junction gate field-effect transistor (JFETs) could be used.

The amplifier may be a class F amplifier. The power amplifier may be a Radio Frequency (RF) power amplifier. The power amplifier may be a microwave power amplifier. The power amplifier may be a millimeter-wave power amplifier.

For the purposes of this disclosure "Radio Frequency" (RF) refers to frequencies typically in the range of, but not limited to 10 MHz≤f≤30 GHz. For the purposes of this disclosure "microwave" refers to frequencies typically in the range of, but not limited to 300 Mhz≤f≤300 GHz. For the purposes of this disclosure "millimeter-wave" refers to frequencies typically in the range of but not limited to 30 GHz≤f≤300 GHz.

According to another aspect of the disclosure, there is provided an integrated circuit comprising a power amplifier of the kind set out above.

The inductances may be formed by inductor windings formed in a metallization stack of the integrated circuit. At least some of the windings forming the first inductance may be arranged directly above or directly beneath at least some of the windings forming the second inductance in the metallization stack. This can reduce the area required in the metallization stack that is required to accommodate the windings for forming the choke and harmonic trap of the power amplifier. In embodiments having the aforementioned second circuit branch, at least some of the windings forming the third inductance may be arranged directly above or directly beneath at least some of the windings forming the fourth inductance in the metallization stack. Again, this can reduce the area required in the metallization stack that is required to accommodate the windings for forming the choke and harmonic trap of the power amplifier. The windings forming the first and second inductances may be laterally separated in the metallization stack from the windings forming the third and fourth inductances. This may reduce unwanted coupling between the windings forming the first and second inductances and the windings forming the third and fourth inductances.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Figure 1:
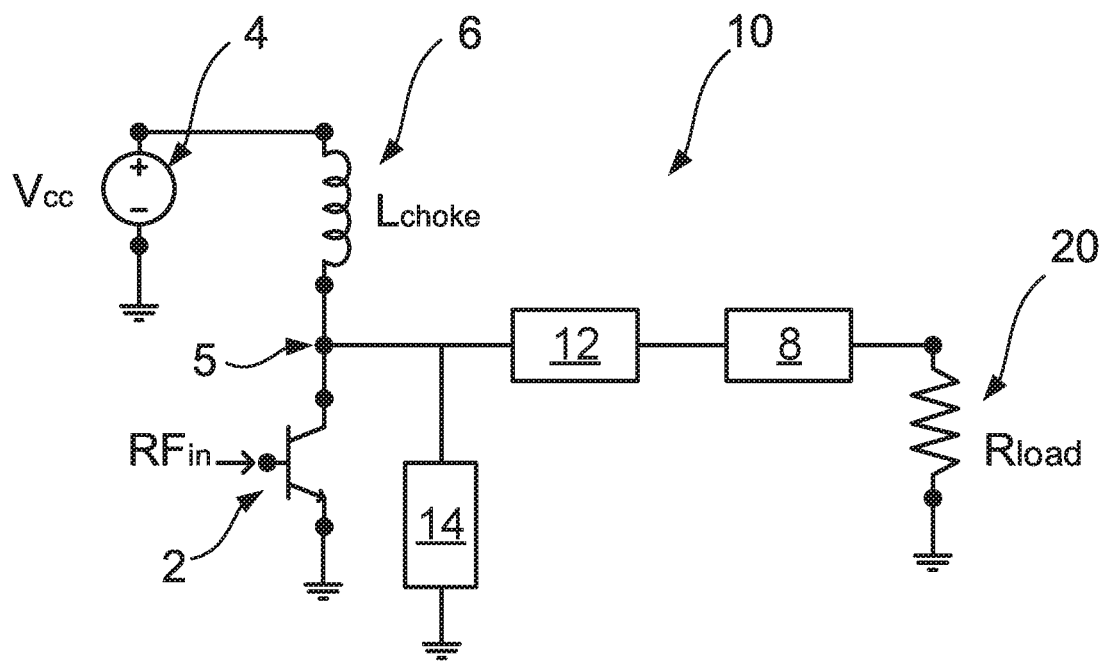
FIG. 1 shows a schematic of an example of a class-F amplifier.

FIG. 1 shows a schematic of an example of a class-F amplifier 10. The amplifier 10 includes an output transistor 2, which may be a bipolar junction transistor. The base of the transistor 2 is coupled to receive in input RF signal ($RF_{in}$) for amplification.

The emitter of the output transistor 2 is coupled to ground. The collector of the output transistor 2 is coupled to a node 5. The node 5 is coupled to a voltage source 4 via an inductor 6. The inductor 6 forms an RF choke (RFC) of the amplifier 10. The RF choke resonates with the collector to the ground capacitance of the transistor 2.

The amplifier 10 also includes a matching network 8, which transforms the resistive load 20 ($R_{load}$) to a desired load-line of the amplifier 10. Resistive load 20 may typically comprise the load presented by an antenna in an RF device incorporating the amplifier 10.

The amplifier 10 also includes odd-harmonics-opens 12, which typically include one or more passives coupled in series between the matching network 8 and the node 5. The amplifier 10 further includes shunt even-harmonics-shorts 14, which typically include one or more passives coupled between the node 5 and AC ground.

A common problem in high frequency and high power amplifier design lies in the design of the transistor core. The electrical size of a large transistor's layout, required for high power applications, can no longer be considered a lumped component at higher frequencies (especially for the harmonics). In order to lower the temperature rise of the output transistor 2 in a power amplifier 10 (due to high power dissipation), the output transistor 2 may divided into a plurality of smaller cells. An example of this is shown schematically in FIG. 2, in which four separate transistor cells 30A, 30B, 30C, 30D are provided. To reduce the thermal resistance and source degeneration, the layout of the amplifier may also be adapted to locate thermal and ground pads near each transistor cell 30A, 30B, 30C, 30D. However, a downside of this approach is that the physical size of the layout may be relatively large. Moreover, providing the load impedance to each transistor cell 30A, 30B, 30C, 30D is challenging in this design.

To minimize possible load imbalances seen by different transistor cells 30A, 30B. 30C, 30D, two separate RF chokes can be used. These RF chokes may be provided in separate branches of the amplifier circuit. An example of this is shown in FIG. 3.

Figure 2:
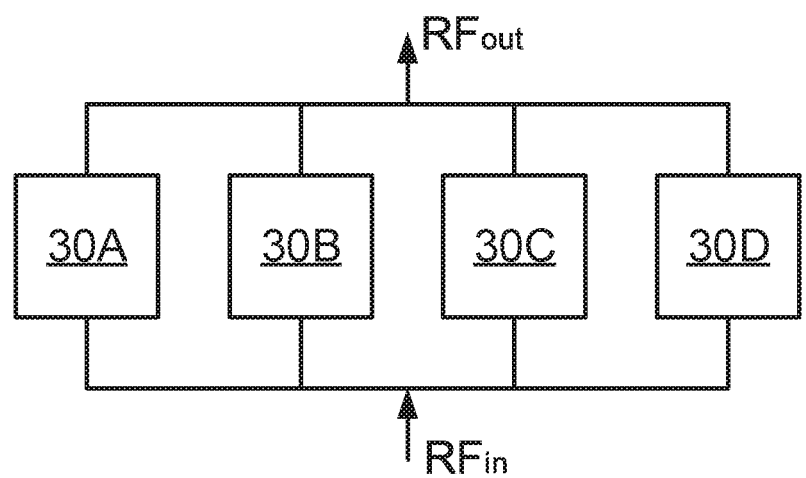
FIG. 2 shows a schematic of an example of the power stage of a power amplifier.
Figure 3:
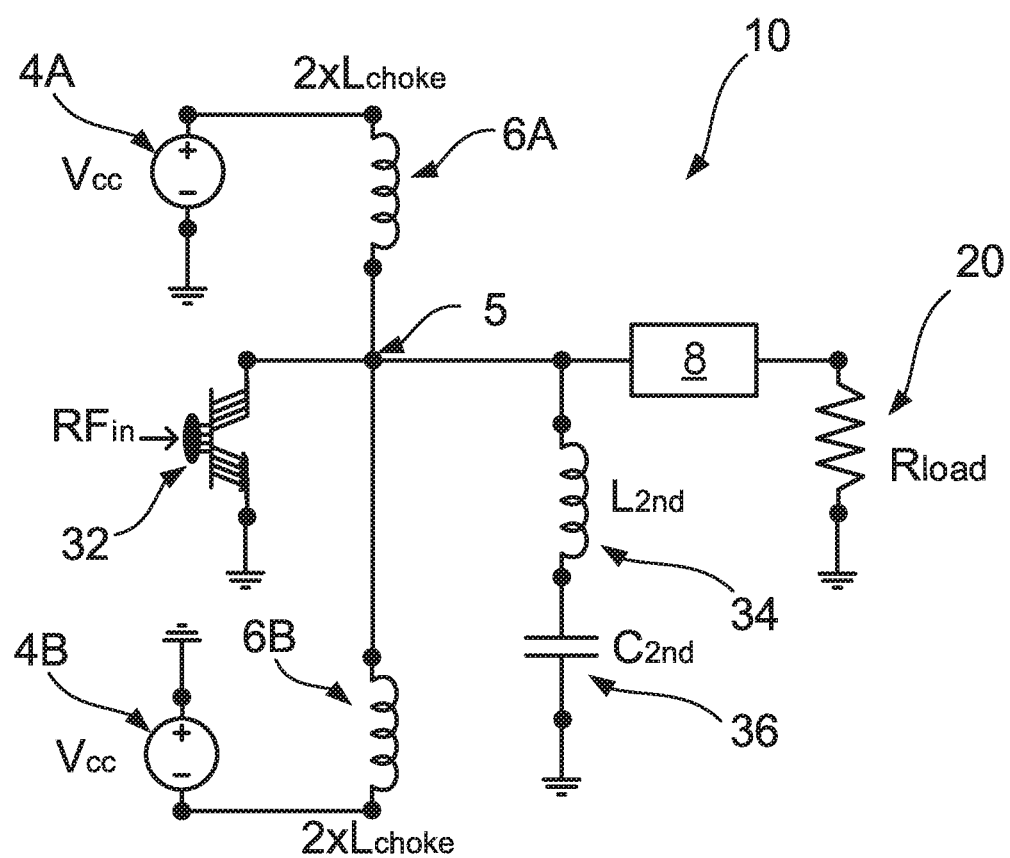
FIG. 3 shows a schematic of another example of a class-F amplifier.

The amplifier 10 in FIG. 3 includes output transistors corresponding to those provided in the separate transistor cells 30A, 30B, 30C, 30D of FIG. 2 (these are represented collectively in FIG. 3 at reference numeral 32). The base of the output transistor 32 in each cell is coupled to receive the input RF signal (RF$_{in}$) for amplification.

The emitter of each output transistors 32 is coupled to ground. The collector of each output transistor 32 is coupled to a node 5. The node 5 is coupled to a voltage source 4A in a first branch via an inductor 6A. The inductor 6A forms a first RF choke (RFC) of the amplifier 10. The node 5 is also coupled to a voltage source 4B in a second branch via an inductor 6B. The inductor 6B forms a second RF choke (RFC) of the amplifier 10. Note that the inductance values of the inductors 6A, 6B may be 2×L$_{choke}$, where L$_{choke}$ is the inductance used in an amplifier of the kind shown in FIG. 1, in which there is only a single inductor 6 forming an RF choke. The RF chokes in FIG. 3 resonate with the collectors to the ground capacitances of the transistors 32. The capacitance seen at the fundamental of the 2nd-harmonic short is also tuned out by the choke inductors 6A, 6B.

The amplifier 10 also includes a matching network 8, which transforms the resistive load 20 (R$_{load}$) to a desired load-line of the amplifier 10 as described above in relation to FIG. 1. Again, the resistive load 20 may typically comprise the load presented by an antenna in an RF device incorporating the amplifier 10.

The amplifier 10 further includes shunt even-harmonics-shorts. In the present example, these include an inductor 34 and a capacitor 36. The inductor 34 may have a first terminal coupled to the node 5 and a second terminal coupled to a first terminal of the capacitor 36. A second terminal of the capacitor 36 may be coupled to AC ground. Accordingly, the inductor 34 and capacitor 36 are coupled in series between the node 5 and AC ground. The inductance of the inductor 34 and the capacitance of the capacitor 36 may be chosen according to the 2$^{nd}$ harmonic of the RF signal to be amplified.

In the case of an amplifier of the kind shown in FIG. 3, the load seen by the transistor cells 30A, 30B, 30C, 30D would be substantially identical at the first harmonic. However, a downside of the approach taken in FIG. 3 is that the provision of two RF chokes requires more inductors to be used, using up twice as much space. Accordingly, layout constrains may become quite tight. This may in turn even result in performance deterioration in the power amplifier 10, as the coupling among the inductors become larger, which may affect the load impedance seen by the transistors 32 at the first and higher harmonic frequencies. Moreover, in this layout, the 2$^{nd}$ harmonic load seen by each cell may still remain imbalanced.

Figure 4:
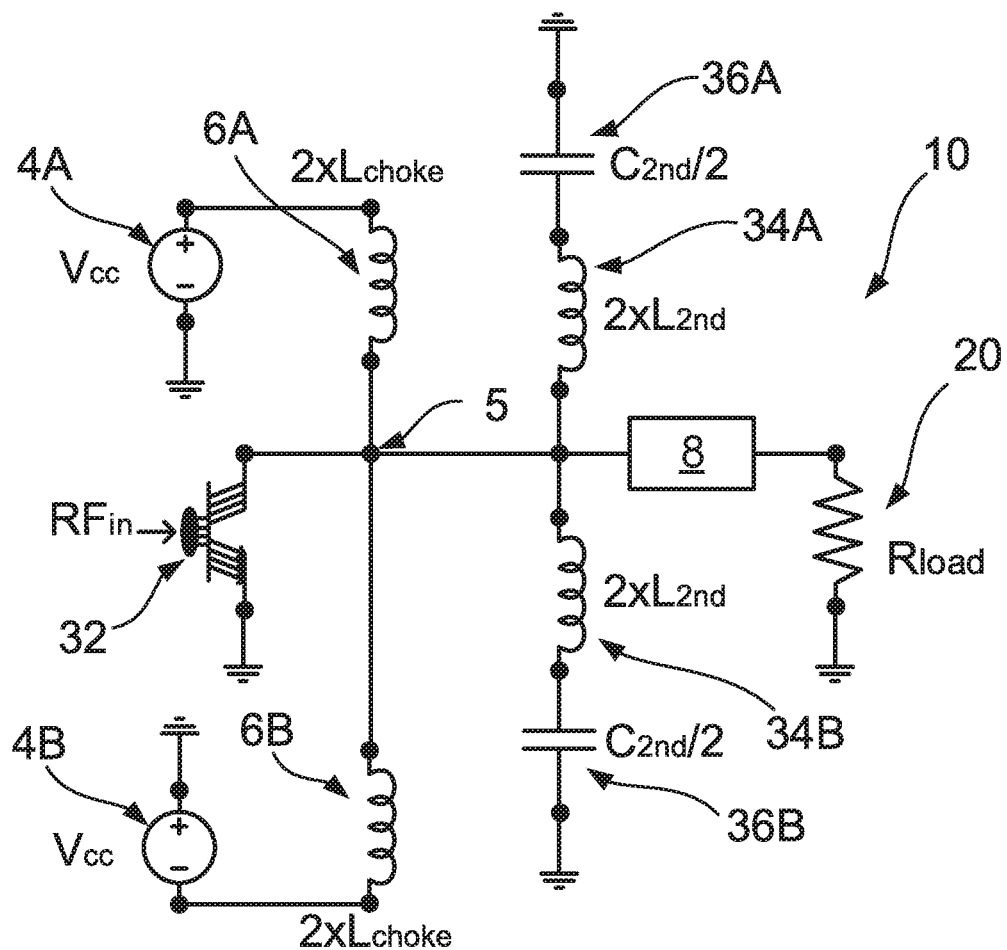
FIG. 4 shows a schematic of a further example of a class-F amplifier.

The 2$^{nd}$ harmonic trap formed by the inductor 34 and capacitor 36 in FIG. 3 may also be split into two branches, as shown in FIG. 4. In FIG. 4, the 2$^{nd}$ harmonic trap includes a first branch and a second branch.

The first branch includes an inductor 34A and a capacitor 36A. The inductor 34A may have a first terminal coupled to the node 5 and a second terminal coupled to a first terminal of the capacitor 36A. A second terminal of the capacitor 36A may be coupled to AC ground. Accordingly, the inductor 34A and capacitor 36A of the first branch are coupled in series between the node 5 and AC ground.

The second branch includes an inductor 34B and a capacitor 36B. The inductor 34B may have a first terminal coupled to the node 5 (whereby the first terminals of the inductors 34A, 34B are coupled together) and a second terminal coupled to a first terminal of the capacitor 36B. A second terminal of the capacitor 36B may be coupled to AC ground. Accordingly, the inductor 34B and capacitor 36B of the first branch are coupled in series between the node 5 and AC ground.

The inductances of the inductors 34A, 34B and the capacitances of the capacitors 36A, 36B may be chosen according to the 2$^{nd}$ harmonic of the RF signal to be amplified. In the present example, the inductance values of the inductors 34A, 34B may be 2×L$_{2nd}$, and the capacitance values of the capacitors 36A, 36B may be C$_{2nd}$/2, where L$_{2nd}$ and C$_{2nd}$ are the inductance and capacitance values that would be used according to the 2$^{nd}$ harmonic in an amplifier in which the 2$^{nd}$ harmonic trap is provided in a single branch (e.g. the amplifier 10 of FIG. 3).

The other components of the amplifier 10 shown in FIG. 4 may be substantially the same as described above in relation to FIG. 3.

A further potential downside of the approach taken in FIGS. 3 and 4 is that, when the 2$^{nd}$ harmonic trap is provided in separate branches (as in FIG. 4), additional inductor being required, those additional inductors having larger inductance values than the inductor used in a 2$^{nd}$ harmonic trap comprising a single branch. Layout limitations, particularly in on-chip designs, may therefore prohibit the implementation of an amplifier 10 of the kind shown in FIG. 4.

Figure 5:
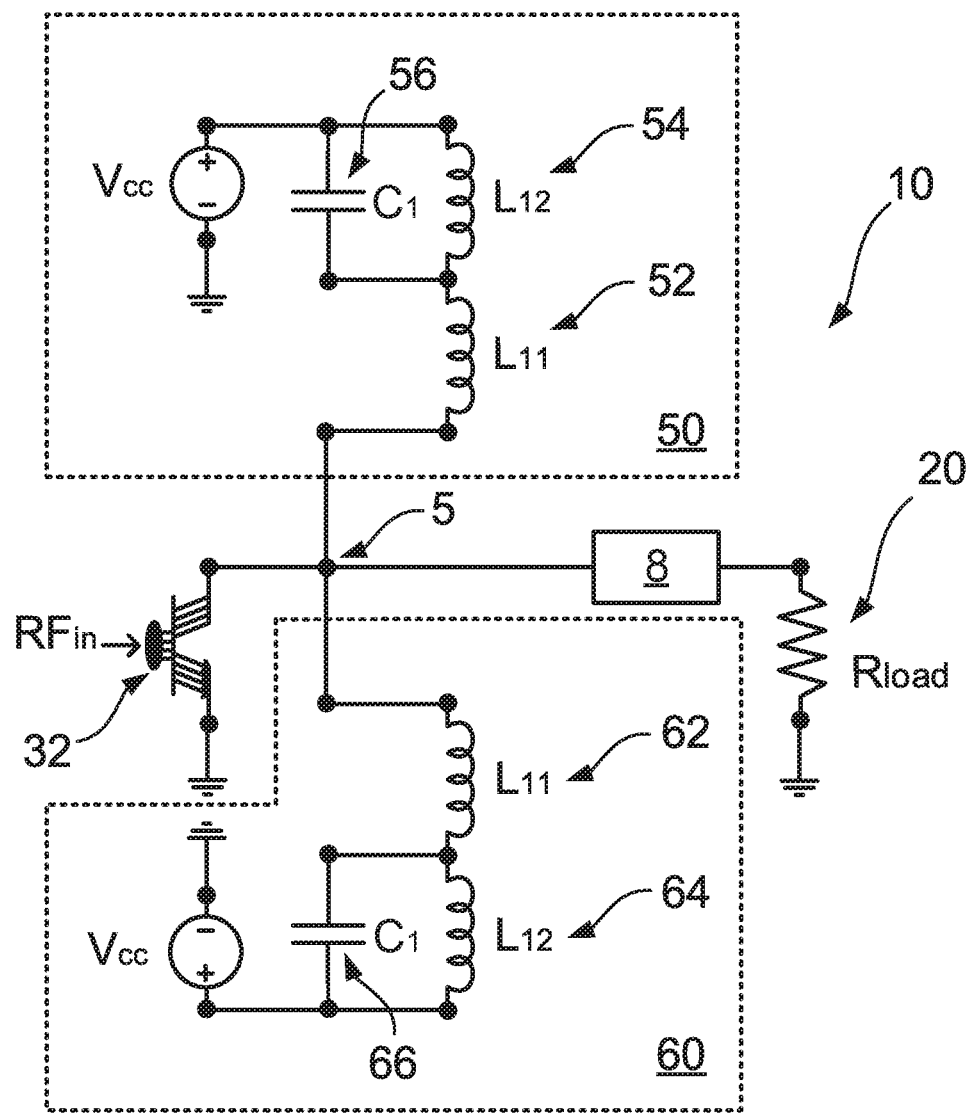
FIG. 5 shows a schematic of an amplifier according to an embodiment of the present disclosure.

FIG. 5 shows a schematic of a power amplifier 10 according to an embodiment of the present disclosure. The power amplifier 10 includes a plurality of transistors 32. The transistors 32 are coupled in parallel. For instance, each transistor 32 may be provided in a respective cell (e.g. 30A, 30B, 30C, 30D . . . ) as described above in relation to FIG. 2. Each transistor 32 has a control terminal coupled to receive a signal to be amplified. Each transistor 32 also has an output terminal coupled to a node 5.

In the present embodiment, each transistor 32 is a bipolar junction transistor. The bipolar junction transistors may be NPN bipolar junction transistors as shown in the Figures, but it is also envisaged that PNP bipolar junction transistors could be used. In the present embodiment, control terminal of each transistor 32 is a base terminal of each bipolar junction transistor. In the present embodiment, the output terminal of each transistor 32 is a collector terminal of each bipolar junction transistor. As shown in shown in FIG. 5, the emitter terminal of each bipolar junction transistor may be coupled to ground. It is also envisaged that in some examples, the transistors may comprise NPN bipolar junction transistors coupled in a common base configuration. It is further envisaged that the power amplifier 10 may include a cascode as an output stage for the transistors 32.

It is also envisaged that the transistors 32 may be Field Effect Transistors (FETs). For instance, the transistors 32 may be MOSFET transistors. In such embodiments, each control terminal would be a gate terminal of one of the MOSFET transistors and each output terminal would be either a source terminal or a drain terminal of one of the MOSFET transistors. The other terminal (source terminal or drain terminal that is not connected to the node 5) may be connected to ground, in the same way that the emitter of the bipolar junction transistors shown in FIG. 5 are connected to ground. It is further envisaged that High Electron Mobility Transistors (HEMTs), metal-semiconductor field-effect transistors (MESFETs) or junction gate field-effect transistor (JFETs) could be used.

In the present embodiment, the signal to be amplified is an RF signal (RF$_{in}$). It is also envisaged that the signal to be amplified may be a microwave signal or a millimeter-wave signal.

The power amplifier 10 also includes a matching network 8. The matching network 8 may include one of more passive components such as inductors or capacitors. The matching network 8 has an output that is coupled to a resistive load 20. The matching network 8 may transform the resistive load 20 ($R_{load}$) to a desired load-line of the power amplifier 10. The resistive load 20 may, for instance, comprise the load presented by an antenna in a device (e.g. RF device, microwave device or millimeter-wave device) incorporating the power amplifier 10. The matching network 8 also has an input that is coupled to the node 5. Accordingly, the input of the matching network 8 is coupled to the output of each of the plurality of transistors 32.

The power amplifier 10 may be a class F amplifier. Class F amplifiers may use output networks including passives to reduce power consumption and consequently improve efficiency by exploiting harmonics. In the present embodiment, the power amplifier 10 exploits the second harmonic of the RF, microwave or millimeter-wave signal.

According to embodiments of this disclosure, the power amplifier 10 may include one or more circuit branches that form a choke and harmonic trap of the power amplifier 10. In the present embodiment, the power amplifier 10 includes a first circuit branch 50 and a second circuit branch 60, but it is envisaged that the power amplifier 10 may in some embodiments include a single such circuit branch (e.g. either the circuit branch 50 or the circuit branch 60).

The first circuit branch 50 includes a first inductance 52, a second inductance 54 and a first capacitor 56. Each inductance 52, 54 may be provided by an inductor. The inductors forming the inductances 52, 54 may be separate inductors, which may be coupled in series.

The first inductance 52 has a first terminal that is coupled to the node 5. Accordingly, the first terminal of the first inductance 52 may be coupled to the output of each of the plurality of transistors 32. A second terminal of the first inductance 52 is coupled to a first terminal of the second inductance 54. A second terminal of the second inductance 54 is coupled to AC ground, e.g. via a voltage source $V_{cc}$. The first capacitor 56 is coupled in parallel with the second inductance 54. In particular, a first terminal of the first capacitor 56 may be coupled to the first terminal of the second inductance 54 and a second terminal of the first capacitor 56 may be coupled to the second terminal of the second inductance 54.

The second circuit branch 60 may be configured similarly to the first circuit branch 50. Accordingly, the second circuit branch 60 in this embodiment includes a third inductance 62, a fourth inductance 64 and a second capacitor 66. As with the first circuit branch 50, each inductance 62, 64 may be provided by an inductor. The inductors forming the inductances 62, 64 may be separate inductors, which may be coupled in series.

The third inductance 62 has a first terminal that is coupled to the node 5. Accordingly, the first terminal of the third inductance 62 may be coupled to the output of each of the plurality of transistors 32. A second terminal of the third inductance 62 is coupled to a first terminal of the fourth inductance 64. A second terminal of the fourth inductance 64 is coupled to AC ground, e.g. via a voltage source $V_{cc}$. The second capacitor 66 is coupled in parallel with the fourth inductance 64. In particular, a first terminal of the second capacitor 66 may be coupled to the first terminal of the fourth inductance 64 and a second terminal of the second capacitor 66 may be coupled to the second terminal of the fourth inductance 64.

Compared to power amplifiers of the kind shown in FIGS. 1, 3 and 4, in which the choke and harmonic trap functions are provided separately, in their own dedicated circuit branches, in a power amplifier 10 according to an embodiment of this disclosure, the choke and harmonic trap functions are provided in the same circuit branch. Thus the circuit branch 50 can provide both choke and harmonic trap functions for the power amplifier 10 and the circuit branch 60 can also provide both choke and harmonic trap functions for the power amplifier 10.

Figure 6:
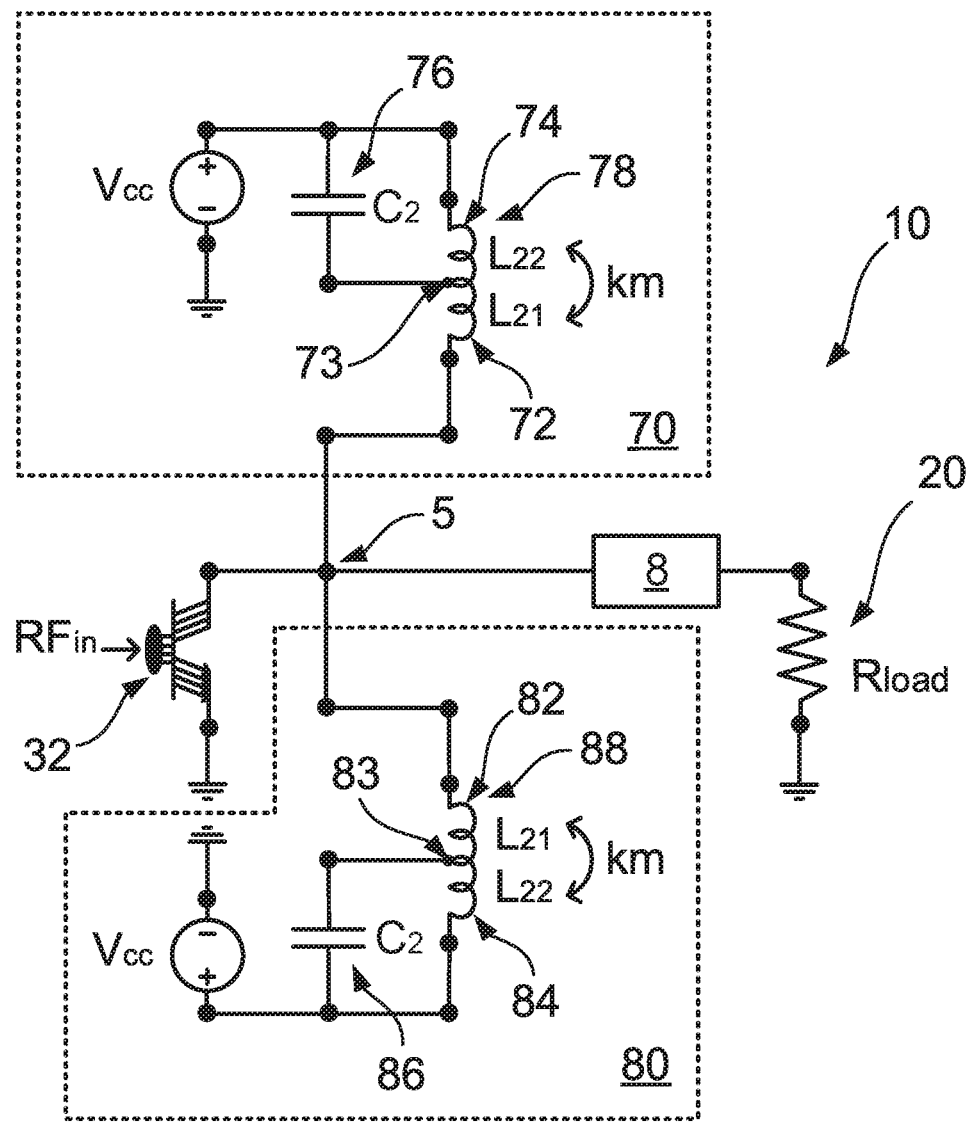
FIG. 6 shows a schematic of an amplifier according to another embodiment of the present disclosure.

Although a single circuit branch could be used to provide the choke and harmonic trap functions for the power amplifier 10, more than one such circuit branch may be provided (e.g. there are two such circuit branches 50, 60 in the embodiment of FIG. 6), so as to allow a larger choke inductance to be provided for the power amplifier 10 and to allow for better load balancing between the plurality of transistors 32.

The rearrangement of the components (inductances, capacitances) that provide the choke and harmonic trap functions of a power amplifier into the same circuit branch can reduce the overall number and/or size of the components required. This can in turn save space, for instance on an integrated circuit embodying the power amplifier 10.

FIG. 6 shows a schematic of an amplifier according to another embodiment of the present disclosure. The power amplifier in FIG. 6 is similar in some respects to the power amplifier described above in relation to FIG. 5 and only the differences will be described in detail below.

As with the embodiment of FIG. 5, the power amplifier 10 in FIG. 6 includes two circuit branches 70, 80 that form a choke and harmonic trap of the power amplifier 10. As mentioned previously, it is envisaged that the power amplifier 10 may include only single such circuit branch (or, indeed, more than two such circuit branches).

A first circuit branch 70 of the power amplifier 10 in FIG. 6 includes a first inductance 72, a second inductance 74 and a first capacitor 76. In contrast to FIG. 5, the inductances in the embodiment of FIG. 6 are provided by an auto-transformer 78. The auto-transformer 78 may include a common winding, part of which forms the first inductance 72 and part of which forms the second inductance 74.

As with the embodiment of FIG. 5, the first inductance 72 has a first terminal that is coupled to the node 5 (by way of example, a first end of the common winding of the auto-transformer 78 may be coupled to the node 5). Accordingly, the first terminal of the first inductance 72 may be coupled to the output of each of the plurality of transistors 32.

As with the embodiment of FIG. 5, a second terminal of the first inductance 72 is coupled to a first terminal of the second inductance 74. The second terminal of the first inductance 72 and the first terminal of the second inductance 74 may be considered to be located at the point on the common winding of the auto-transformer 78 at which the part of the common winding that forms the first inductance 72 meets the part of the common winding that forms the second inductance 74. As described below, this point may be provided with a tap 73.

A second terminal (by way of example, a second end of the common winding of the auto-transformer 78) of the second inductance 74 is coupled to AC ground, e.g. via a voltage source $V_{cc}$.

The first capacitor 76 is coupled in parallel with the second inductance 74. In particular, a first terminal of the first capacitor 76 may be coupled to the first terminal of the second inductance 74 and a second terminal of the first capacitor 76 may be coupled to the second terminal of the second inductance 74. To implement this, the point at which the part of the common winding that forms the first inductance 72 meets the part of the common winding that forms the second inductance 74 may be tapped, and the tap 73 may be connected to the first terminal of the first capacitor 76.

The second circuit branch 80 may be configured similarly to the first circuit branch 70. Accordingly, the second circuit branch 80 includes a third inductance 82, a fourth inductance 84 and a second capacitor 86. Again, the inductances 82, 84 in this embodiment are provided by an auto-transformer 88. The auto-transformer 88 may include a common winding, part of which forms the third inductance 82 and part of which forms the fourth inductance 84.

As with the first circuit branch 70, the third inductance 82 of the second circuit branch 80 has a first terminal that is coupled to the node 5 (by way of example, a first end of the common winding of the auto-transformer 88 may be coupled to the node 5). Accordingly, the first terminal of the third inductance 82 may be coupled to the output of each of the plurality of transistors 32.

As with the first circuit branch 70, a second terminal of the third inductance 82 of the second circuit branch 80 is coupled to a first terminal of the fourth inductance 84. The second terminal of the third inductance 82 and the first terminal of the fourth inductance 84 may be considered to be located at the point on the common winding of the auto-transformer 88 at which the part of the common winding that forms the third inductance 82 meets the part of the common winding that forms the fourth inductance 84. Again, this point may be provided with a tap 83.

A second terminal (by way of example, a second end of the common winding of the auto-transformer 88) of the fourth inductance 84 is coupled to AC ground, e.g. via a voltage source $V_{cc}$.

The second capacitor 86 is coupled in parallel with the fourth inductance 84. In particular, a first terminal of the second capacitor 86 may be coupled to the first terminal of the fourth inductance 84 and a second terminal of the second capacitor 86 may be coupled to the second terminal of the fourth inductance 84. To implement this, the point at which the part of the common winding that forms the third inductance 82 meets the part of the common winding that forms the fourth inductance 84 may be tapped, and the tap 83 may be connected to the first terminal of the second capacitor 86.

As described already in relation to the embodiment of FIG. 5, the circuit branches 70, 80 in FIG. 6 can each provide both choke and harmonic trap functions for the power amplifier 10. Again, the rearrangement of the components (inductances, capacitances) that provide the choke and harmonic trap functions of a power amplifier into the same circuit branch can reduce the overall number and/or size of the components required. This can in turn save space, for instance on an integrated circuit embodying the power amplifier 10.

The use of an auto-transformer 78, 88 to provide the inductances 72, 74, 82, 84 of the first and second circuit branches 70, 80 may further reduce the overall number and/or size of the components required provide the choke and harmonic trap functions of the power amplifier 10 (e.g. compared to the embodiment of FIG. 5, in which each inductance 52, 54, 62, 64 may be provided by a separate inductor). The use of an auto-transformer may also reduce the DC resistance of the choke function provided by the branch (e.g. compared to the use of separate inductors), which may improve the overall efficiency and output power of the power amplifier 10.

According to embodiments of the present disclosure, the power amplifier may be implemented in an integrated circuit. The integrated circuit may have a metallization stack located on a major surface thereof. As is known in the art, a metallization stack generally includes a plurality of metal layers including patterned metal features interspersed with a dielectric. Each metal layer may be separated from a neighbouring metal layer in the stack by an intervening dielectric layer. These dielectric layers may include metal filled vias, for interconnecting the patterned metal features of the metal layers. In such embodiments, the inductances of each circuit branch (e.g. the circuit branches 50, 60, 70, 80) may be formed by inductor windings formed in a metallization stack of the integrated circuit.

Figure 7:
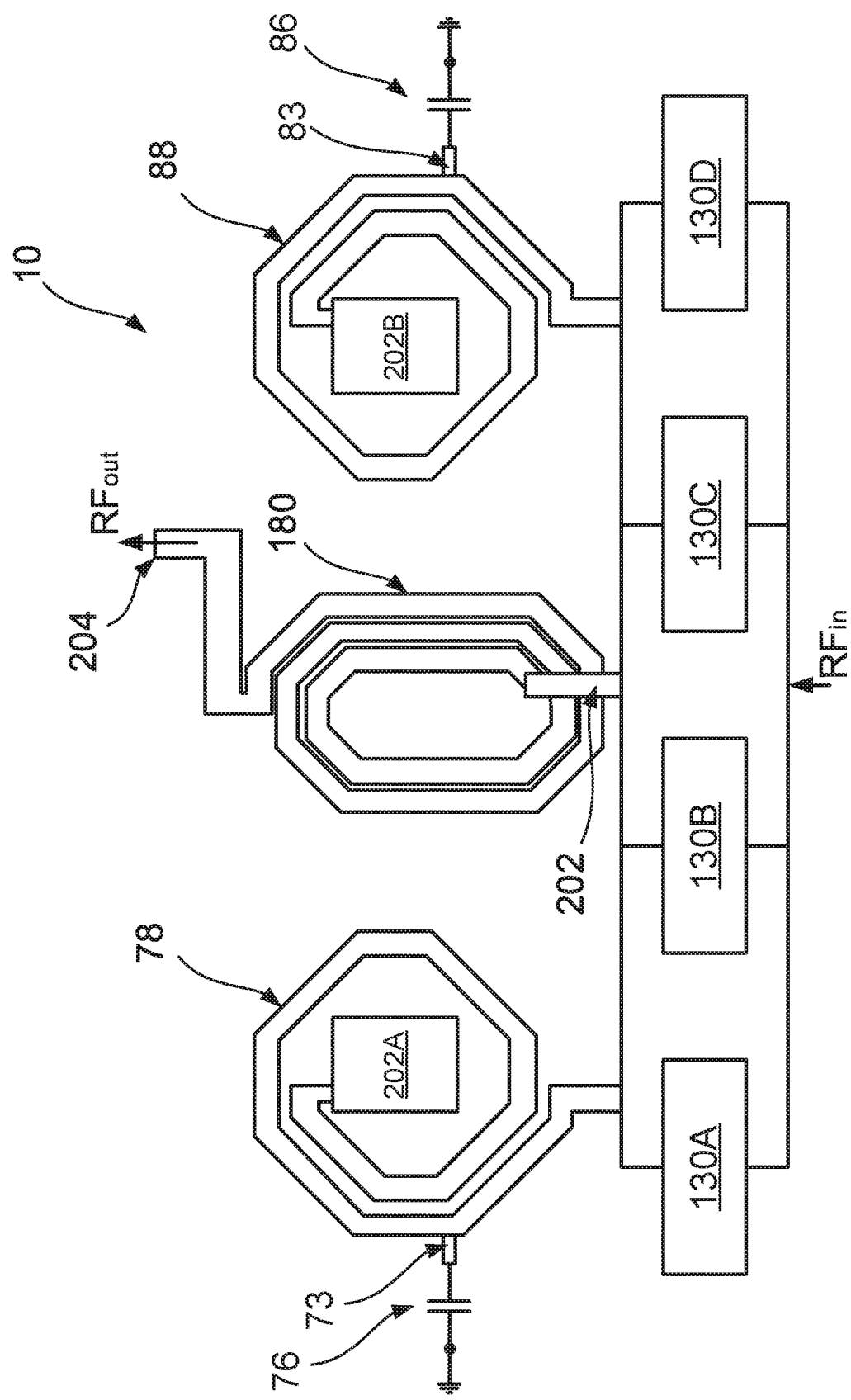
FIG. 7 shows a schematic of a layout of a power stage of a power amplifier according to an embodiment of the present disclosure.

FIG. 7 shows a schematic of a layout of a power stage of a power amplifier 10 according to an embodiment of the present disclosure. In this embodiment, the power amplifier 10 is implemented in an integrated circuit and the passives (e.g. the inductances and the capacitors) of the circuit branches are provided in a metallization stack as mentioned above.

As described above in relation to FIG. 2, the transistors (e.g. the transistors 32 described above in relation to FIGS. 5 and 6) in the present embodiment are provided in a plurality (e.g. four) separate transistor cells 130A, 130B, 130C, 130D. The base of the transistor 32 in each cell 130A, 130B, 130C, 130D is coupled to receive an input signal, which may be an RF signal (e.g. $RF_{in}$ as shown in FIG. 7), microwave signal or millimeter-wave signal, for amplification. To reduce the temperature resistance and source degeneration, the layout of the power amplifier 10 may also be adapted to locate thermal and ground pads near each transistor cell 30A, 30B, 30C, 30D.

The power amplifier 10 in this embodiment includes a matching circuit 8 as described above in relation to FIGS. 5 and 6. The matching circuit 8 in this embodiment includes an inductor 180. One of the terminals 202 of the inductor 180 may be coupled to the transistor cells 130A, 130B, 130C, 130D (e.g. via the node 5 described above). Another of the terminals 204 of the transistor 180 may be coupled to a load, such as an antenna.

The power amplifier 10 in this example includes two circuit branches of the kind described above in relation to FIG. 6. Thus, the first branch includes an auto-transformer 78 and capacitor 76, with the capacitor terminals being coupled to AC ground and to a tap 73 of the auto-transformer 78. A first terminal of the auto-transformer 78 to coupled to the transistor cells 130A, 130B, 130C, 130D (e.g. via the node 5 described above). A second terminal of the auto-transformer 78 may be connected to a $V_{cc}$ pad 202A. Similarly, the second branch includes an auto-transformer 88 and capacitor 86, with the capacitor terminals being coupled to ground and to a tap 83 of the auto-transformer 78. A first terminal of the auto-transformer 88 to coupled to the transistor cells 130A, 130B, 130C, 130D (e.g. via the node 5 described above). A second terminal of the auto-transformer 88 may be connected to a $V_{cc}$ pad 202B.

The windings of the auto-transformers 78, 88 and of the inductor 180 in the present embodiment are formed by patterned metal features in a metallization stack. These windings may be located in a plurality of layers of the stack. By way of example, the turns of the transistor 180 and of the common windings of the auto-transformers 78, 88 may be located in a series of layers in the stack, in which the turn in each layer is coupled to the turn in a next layer using a metal filled via. The plates of the capacitors 76, 86 may also be implemented using patterned metal features in the metallization stack.

When the passives (e.g. the inductances and the capacitors) of the circuit branches are provided in a metallization stack as mentioned above, at least some of the windings forming the first inductance (e.g. 52, 62, 72, 82) of a circuit branch may be arranged directly above or directly beneath at least some of the windings forming the second inductance (e.g. 54, 64, 74, 84) of that circuit branch in the metallization stack. This can reduce the area required in the metallization stack that is required to accommodate the windings for forming the choke and harmonic trap of the power amplifier.

As shown in FIG. 7, in the present embodiment, which includes two circuit branches, the turns of the auto-transformer 78 and the turns of the auto-transformer 88 are laterally separated from each other in the metallization stack (that is to say there is no overlap between the turns of the auto-transformer 78 and the turns of the auto-transformer 88 when viewing the metallisation stack in a direction parallel to the surface normal of one of the layers of the stack). Separating the turns of the auto-transformer 78 from the turns of the auto-transformer 88 in this way may reduce unwanted coupling between the common winding forming the first and second inductances (e.g. 72, 74) in the auto-transformer 78 and the common winding forming the third and fourth inductances (e.g. 82, 84) in the auto-transformer 88.

The rearrangement of the components in the circuit branches described herein may require appropriate selection of the inductance and capacitance values that are used. Examples of this are described below.

In the embodiment of FIG. 5, the various inductances and capacitances of the circuit branches 50, 60 may have the following values:
first inductance 52: $L_{11}$
second inductance 54: $L_{12}$
third inductance 62: $L_{11}$
fourth inductance 64: $L_{12}$
first capacitor 56: $C_1$
second capacitor 66: $C_1$ Note that these values are also marked in FIG. 5 itself. Note that the corresponding components of each circuit branch 50, 60 in this example generally have the same value (as the circuit branches are generally symmetrical).

These inductance and capacitance values may be calculated using the following equations:

$$L_{11} = \frac{2 \times L_{Choke} \times L_{2nd}}{L_{Choke} + L_{2nd}}$$

$$L_{12} = \frac{2 \times L_{Choke}^2}{L_{Choke} + L_{2nd}}$$

$$C_1 = \frac{(L_{Choke} + L_{2nd})^2}{L_{Choke}^2} \times \frac{C_{2nd}}{2}$$

where $L_{choke}$, $L_{2nd}$ and $C_{2nd}$ are the inductance values discussed above in relation to FIGS. 1, 3 and 4.

In the embodiment of FIG. 6, the various inductances and capacitances of the circuit branches 50, 60 may have the following values:
first inductance 72: $L_{21}$
second inductance 74: $L_{22}$
third inductance 82: $L_{21}$
fourth inductance 84: $L_{22}$
first capacitor 76: $C_2$
second capacitor 86: $C_2$ Note that these values are also marked in FIG. 6 itself. Again, note that the corresponding components of each circuit branch 70, 80 in this example generally have the same value (as the circuit branches are generally symmetrical).

These inductance and capacitance values may be calculated using the following equations:

$$L_{21} = \frac{L_{11}}{1 - k_m^2}$$

$$L_{22} = \frac{L_{12}}{n^2}$$

$$C_2 = n^2 \times C_1$$

$$n = 1 + km\sqrt{\frac{L_{21}}{L_{22}}}$$

where $L_{11}$, $L_{12}$ and $C_1$ are the inductance and capacitance values calculated above in relation to the example of FIG. 5, where km is the coupling factor associated with the mutual inductance between the first inductance 72 and the second inductance 74 (the turns of which are located on top of each other, as mentioned in relation to FIG. 7) and between the third inductance 82 and the fourth inductance 84 (the turns of which are also located on top of each other, as mentioned in relation to FIG. 7), and where n is the turn ratio between primary and secondary windings of the auto-transformer.

It will be appreciated that the values provided above are just examples, and the values that are chosen may also vary according to the number of circuit branches provided in the power amplifier.

Accordingly, there has been described a power amplifier. The power amplifier includes a plurality of parallel coupled transistors. Each transistor has a control terminal coupled to receive a signal to be amplified and an output terminal coupled to a node. The power amplifier also includes a matching network having an input coupled to the node and an output coupleable to a load. The power amplifier further includes a first circuit branch forming a choke and harmonic trap of the power amplifier. The first circuit branch includes a first inductance, a second inductance and a first capacitor. The first inductance has a first terminal coupled to the node and a second terminal coupled to a first terminal of the second inductance. A second terminal of the second inductance is coupled to AC ground. The first capacitor is coupled in parallel with the second inductance.

Although particular embodiments of this disclosure have been described, it will be appreciated that many modifications/additions and/or substitutions may be made within the scope of the claims.

The invention claimed is:
1. A power amplifier comprising:
a plurality of parallel coupled transistors, wherein each transistor has a control terminal coupled to receive a signal to be amplified and an output terminal coupled to a node;
a matching network having an input coupled to said node and an output coupleable to a load;
a first circuit branch forming a choke and harmonic trap of the power amplifier, the first circuit branch comprising:
a first inductance;
a second inductance; and a first capacitor,
wherein the first inductance has a first terminal coupled to said node and a second terminal coupled to a first terminal of the second inductance,
wherein a second terminal of the second inductance is coupled to AC ground,
wherein the first capacitor is coupled in parallel with the second inductance;
wherein the power amplifier further comprises a second circuit branch forming a choke and harmonic trap of the power amplifier, the second circuit branch comprising:
a third inductance;
a fourth inductance; and
a second capacitor,
wherein the third inductance has a first terminal coupled to said node and a second terminal coupled to a first terminal of the fourth inductance,
wherein a second terminal of the fourth inductance is coupled to AC ground, and
wherein the second capacitor is coupled in parallel with the second inductance.

2. The power amplifier of claim 1, wherein the first circuit branch includes an auto-transformer coupled to provide said first inductance and said second inductance.

3. A power amplifier comprising:
a plurality of parallel coupled transistors, wherein each transistor has a control terminal coupled to receive a signal to be amplified and an output terminal coupled to a node;
a matching network having an input coupled to said node and an output coupleable to a load;
a first circuit branch forming a choke and harmonic trap of the power amplifier, the first circuit branch comprising:
a first inductance;
a second inductance; and
a first capacitor,
wherein the first inductance has a first terminal coupled to said node and a second terminal coupled to a first terminal of the second inductance,
wherein a second terminal of the second inductance is coupled to AC ground, and
wherein the first capacitor is coupled in parallel with the second inductance;
wherein the first circuit branch includes an auto-transformer coupled to provide said first inductance and said second inductance;
wherein the auto-transformer comprises a common winding, wherein a first part of the common winding provides said first inductance and wherein a second part of the common winding provides said second inductance.

4. A power amplifier comprising:
a plurality of parallel coupled transistors, wherein each transistor has a control terminal coupled to receive a signal to be amplified and an output terminal coupled to a node;
a matching network having an input coupled to said node and an output coupleable to a load;
a first circuit branch forming a choke and harmonic trap of the power amplifier, the first circuit branch comprising:
a first inductance;
a second inductance; and
a first capacitor,
wherein the first inductance has a first terminal coupled to said node and a second terminal coupled to a first terminal of the second inductance,
wherein a second terminal of the second inductance is coupled to AC ground, and
wherein the first capacitor is coupled in parallel with the second inductance;
wherein the first circuit branch includes an auto-transformer coupled to provide said first inductance and said second inductance;
wherein the first terminal of the first inductance comprises a first terminal of the auto-transformer, wherein the second terminal of the second inductance comprises a second terminal of the auto-transformer, and wherein the second terminal of the first inductance and the first terminal of the second inductance comprise a tap of the auto transformer.

5. The power amplifier of claim 4, wherein the tap is located along the common winding at a position intermediate the first part and the second part.

6. The power amplifier of claim 1, wherein the first inductance the second inductance are formed by separate inductors.

7. The power amplifier of claim 4, further comprising:
a second circuit branch forming a choke and harmonic trap of the power amplifier, the second circuit branch comprising:
a third inductance;
a fourth inductance; and
a second capacitor,
wherein the third inductance has a first terminal coupled to said node and a second terminal coupled to a first terminal of the fourth inductance,
wherein a second terminal of the fourth inductance is coupled to AC ground, and
wherein the second capacitor is coupled in parallel with the second inductance.

8. The power amplifier of claim 1, wherein the second circuit branch includes an auto-transformer coupled to provide said third inductance and fourth inductance.

9. The power amplifier of claim 1, wherein the third inductance the fourth inductance are formed by separate inductors.

10. An integrated circuit comprising the power amplifier of claim 1.

11. The integrated circuit of claim 10, wherein the inductances are formed by inductor windings formed in a metallization stack of the integrated circuit, wherein at least some of the windings forming the first inductance are arranged directly above or directly beneath at least some of the windings forming the second inductance in the metallization stack.

12. The power amplifier of claim 10,
wherein the inductances are formed by inductor windings formed in a metallization stack of the integrated circuit, wherein at least some of the windings forming the first inductance are arranged directly above or directly beneath some of the windings forming the second inductance in the metallization stack, and wherein at least some of the windings forming the third inductance are arranged directly above or directly beneath at least some of the windings forming the fourth inductance in the metallization stack.

13. The integrated circuit of claim 12, wherein the windings forming the first and second inductances are laterally separated in the metallization stack from the windings forming the third and fourth inductances.

14. The power amplifier of claim 3, wherein the first terminal of the first inductance comprises a first terminal of the auto-transformer, wherein the second terminal of the second inductance comprises a second terminal of the auto-transformer, and wherein the second terminal of the first inductance and the first terminal of the second inductance comprise a tap of the auto transformer.

15. The power amplifier of claim 3, further comprising:
a second circuit branch forming a choke and harmonic trap of the power amplifier, the second circuit branch comprising:
a third inductance;
a fourth inductance; and
a second capacitor,
wherein the third inductance has a first terminal coupled to said node and a second terminal coupled to a first terminal of the fourth inductance,
wherein a second terminal of the fourth inductance is coupled to AC ground, and
wherein the second capacitor is coupled in parallel with the second inductance.

16. The power amplifier of claim 3, wherein each of said plurality of parallel connected transistors is a bipolar junction transistor, wherein each said control terminal is a base terminal and wherein each said output terminal is a collector terminal.

17. The power amplifier of any preceding claim 4, wherein each of said plurality of parallel connected transistors is a bipolar junction transistor, wherein each said control terminal is a base terminal and wherein each said output terminal is a collector terminal.

18. The power amplifier of claim 1, wherein the amplifier is a class F amplifier.

19. The power amplifier of claim 1, wherein each of said plurality of parallel connected transistors is a bipolar junction transistor, wherein each said control terminal is a base terminal and wherein each said output terminal is a collector terminal.

20. An integrated circuit comprising the power amplifier of claim 3, wherein the inductances are formed by inductor windings formed in a metallization stack of the integrated circuit, wherein at least some of the windings forming the first inductance are arranged directly above or directly beneath at least some of the windings forming the second inductance in the metallization stack.

* * * * *